(12) United States Patent
Hryckowian et al.

(10) Patent No.: US 7,519,927 B1
(45) Date of Patent: Apr. 14, 2009

(54) WIRING METHODS TO REDUCE METAL VARIATION EFFECTS ON LAUNCH-CAPTURE CLOCK PAIRS IN ORDER TO MINIMIZE CYCLE-TIME OVERLAP VIOLATIONS

(75) Inventors: John N. Hryckowian, Raleigh, NC (US); Heidi L. Lagares-Vazquez, Highland, NY (US); Ray Raphy, Poughkeepsie, NY (US); Alan Daniel Stigliani, Hopewell Junction, NY (US); Charles Vakirtzis, New Winsor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/166,561

(22) Filed: Jul. 2, 2008

(51) Int. Cl.
*G06F 17/50* (2006.01)
(52) U.S. Cl. .................. 716/4; 716/1; 716/6; 716/9; 716/10; 716/11; 716/12
(58) Field of Classification Search ............. 716/1, 716/4, 6, 9–12
See application file for complete search history.

(56) References Cited

U.S. PATENT DOCUMENTS

| | | | |
|---|---|---|---|
| 5,130,568 A | 7/1992 | Miller et al. | |
| 5,783,960 A | 7/1998 | Lackey | |
| 5,835,378 A | 11/1998 | Scepanovic et al. | |
| 5,883,812 A | 3/1999 | Fujii | |
| 6,081,022 A | 6/2000 | Mitra et al. | |
| 6,184,702 B1 | 2/2001 | Takahashi et al. | |
| 6,295,634 B1 | 9/2001 | Matsumoto | |
| 6,327,685 B1 | 12/2001 | Koprowski et al. | |
| 6,348,722 B1 | 2/2002 | Yoshikoshi | |
| 6,442,745 B1 | 8/2002 | Arunachalam et al. | |
| 6,448,591 B1 | 9/2002 | Juengling | |
| 6,480,993 B1 | 11/2002 | Suto et al. | |
| 6,480,996 B1 | 11/2002 | Aji et al. | |
| 6,510,545 B1 | 1/2003 | Yee et al. | |
| 6,645,842 B2 | 11/2003 | Igarashi et al. | |
| 6,654,943 B2 | 11/2003 | Clabes et al. | |
| 6,671,859 B1 | 12/2003 | Naylor et al. | |
| 6,678,644 B1 | 1/2004 | Segal | |
| 6,734,472 B2 | 5/2004 | Ho | |
| 6,785,873 B1 * | 8/2004 | Tseng ........................... | 716/4 |

(Continued)

OTHER PUBLICATIONS

Kahng, Andrew B., et al, On Optimal Interconnections for VLSI, pp. i-15, Kluwer Academic Publishers.
Curran, B., et al, Power-Constrained High-Frequency Circuits for the IBM Power6 Microprocessor, Nov. 2007, pp. 715-731, vol. 51, No. 6, IBM.

(Continued)

*Primary Examiner*—Thuan Do
(74) *Attorney, Agent, or Firm*—Keusey, Tutunjian & Bitetto, P.C.

(57) ABSTRACT

Wiring structures and methods for integrated circuit designs which are adapted to reduce metal variation effects on launch-capture clock pairs in order to minimize cycle time overlap violations in launch/capture clocking systems are provided, whereby the A/B/C (test/launch/capture) clock wire nets are designed using a five parallel track wire segment, in which the B clock wire is represented as a double track with one metal track and one adjacent isolation/shielding track, the C clock wire is represented as a double track with one metal track and one adjacent isolation/shielding track, and where the A test clock wire is represented as a single track comprising test signal wire disposed between the B and C signal wires.

1 Claim, 5 Drawing Sheets

U.S. PATENT DOCUMENTS

| | | | |
|---|---|---|---|
| 7,007,259 | B2 | 2/2006 | Shrowty et al. |
| 7,069,528 | B2 | 6/2006 | Kovacs et al. |
| 7,257,797 | B1 | 8/2007 | Waller et al. |
| 7,373,628 | B1 | 5/2008 | Balsdon et al. |
| 2001/0004763 | A1 | 6/2001 | Kato |
| 2001/0013797 | A1 | 8/2001 | Hirairi |
| 2007/0204252 | A1 | 8/2007 | Furnish et al. |
| 2008/0028352 | A1 | 1/2008 | Birch et al. |

OTHER PUBLICATIONS

Berridge, R., et al, IBM Power6 Microprocessor Physical Design and Design Methodology, Nov. 2007, pp. 685-714, vol. 51, No. 6, IBM.

* cited by examiner

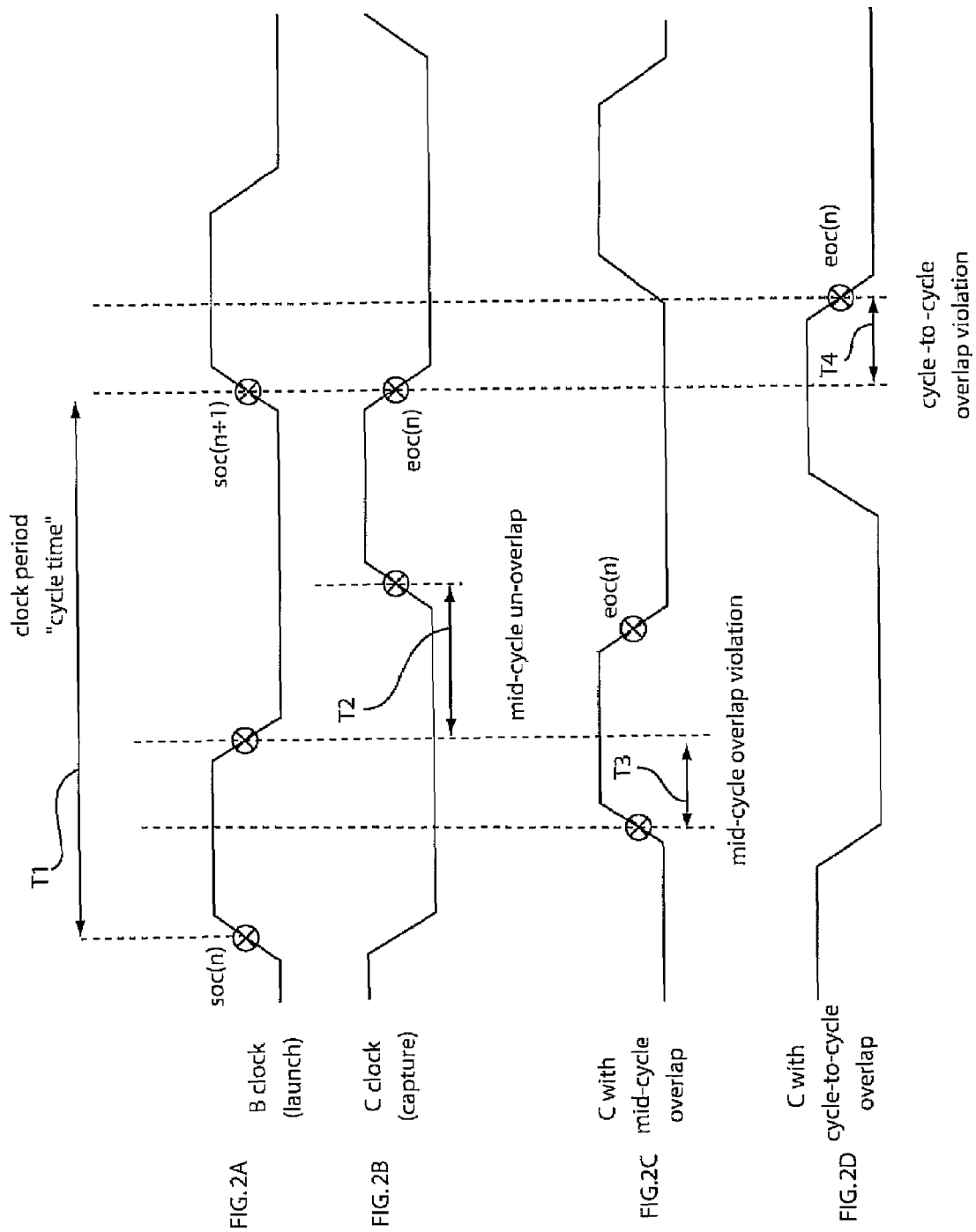

US 7,519,927 B1

WIRING METHODS TO REDUCE METAL VARIATION EFFECTS ON LAUNCH-CAPTURE CLOCK PAIRS IN ORDER TO MINIMIZE CYCLE-TIME OVERLAP VIOLATIONS

TECHNICAL FIELD

Embodiments of the invention generally relate to the field of integrated circuit design, and more particularly, wiring structures and methods for integrated circuit designs which are adapted to reduce metal variation effects on launch-capture clock pairs in order to minimize cycle-time overlap violations in launch/capture clocking systems.

BACKGROUND

Technological advances in semiconductor integrated circuit processing allows IC manufacturers to build IC chips with higher integration densities and smaller design rules leading to increasing complex IC designs having a large number of cells that require complex connections between the cells. The rapid densification of VLSI (Very Large Scale Integrated) circuit devices, associated with high speed circuit performance, and relatively short time-to-market, has driven the need to rapidly characterize and diagnose complex integrated circuit designs early in the product cycle. The most common method of designing logic circuits for placement on IC chips is done with the use of computer systems and software that use computer-aided design (CAD) tools that allow for an efficient design, checking and testing of VLSI circuits using logic synthesis and physical design tools.

In general, a logic synthesis tool takes as input a functional description of a logic circuit and converts it into a technology level description. During logic synthesis, a high-level electronic circuit design is converted into a list of books or cells and their interconnections, which is referred to as a "netlist." A "book" (or cell) refers to an identifiable primitive function (i.e., "cell") (included in a technology library) that includes a pre-designed circuit for performing a certain Boolean function, together with relevant information about the circuit. Following logic synthesis stage, a physical design tool is used for "placement" where the books/cells in the netlist are placed to a physical location on the chip, and "routing" where each net in the netlist is assigned a set of wire segments which implement the interconnections defined by the net. The output of the physical design stage results in a physical layout of the chipstage with a set layout level representation that a chip foundry can use to actually build the chip.

The entire functionality of a digital VLSI IC is controlled and synchronized by various clocks that run through the system. In this regard, the design and implementation of the clocking structure is critical step in the design of a VLSI chip. With the increased clock speeds, process densities and logic complexities, IC designers a faced with significant challenges to meet timing constraints such as cycle-time overlap violations associated with launch and capture clocks in a master-slave latch clocking system.

FIG. 1 is a schematic block diagram of a master-slave latch logic circuit in which wiring methods according to exemplary embodiments of the invention may be implemented for launch and capture clock wires to minimize cycle-time violations. In FIG. 1, a master-slave latch circuit (10) includes a first master/slave latch (10_1) and a second master/slave latch (10_2), each having a master latch L1 and slave latch L2. A logic circuit (11) is connected between the first and second master/slave latches (10_1) and (10_2). A typical clock connection for the master-slave latch circuit (10) comprises three main clock lines, a capture clock C line, a launch clock B line, and a test clock A line. The master latches L1 are controlled by a clock signal C, wherein the assertion of C causes master latches L1 to capture data input to the respective latch (10_1) and (10_2). The slave latches L2 are controlled by the clock signal B, wherein assertion of B signal causes slave latches L2 to launch the data input captured during a previous C pulse to the latch output. The clock signals B and C are complements of each other and the A clock is a clock signal that is used for test purposes. The A clock signal has a significantly lower frequency compared to the B and C clocks and is inactive during the functional mode of the chip.

In order to properly operate in a launch/capture mode, the launch and capture clocks must be properly synchronized otherwise timing errors due to cycle-time overlap violations can significantly impact performance. FIGS. 2A-2D are timing diagrams that illustrate cycle-time issues with regard to synchronization of launch and capture clocks in a master-slave latch circuit of FIG. 1. FIG. 2A illustrates an exemplary B (launch) clock signal that is input to the slave latches L2 and FIGS. 2B-2C illustrate C (capture) clock signals in various timing relationships with the B clock signal in FIG. 2A. The timing diagrams of FIGS. 2A and 2B illustrate proper synchronization between the launch B clock signal and the capture C clock signal. As shown in FIG. 2A, a time period T1 represents a clock cycle "n" which starts at the leading edge of the launch clock (start-of-cycle or soc(n)) and ends at the trailing edge of the subsequent capture clock (end-of-cycle or eoc(n)). In FIG. 2B, the time period T2 (or "mid-cycle un-overlap") denotes a time buffer between the active periods of the launch and capture clocks within the cycle T1. The mid-cycle un-overlap condition as depicted in the timing diagrams of FIGS. 2A and 2B illustrates proper synchronization.

The timing between the launch and capture clocks in FIGS. 2A and 2C illustrate a "mid-cycle overlap violation" where the active periods of the capture and release clocks overlap in a master-slave latch. In FIG. 2C, the time period T3 (or "mid-cycle overlap violation") denotes a time overlap between the active periods of the launch and capture clocks within the cycle T1 wherein the capture and launch clocks for a stage are active at the same time. This timing violation leads to an unstable flush-through state for the latch resulting in loss of valid data. In this condition, the capture and launch clocks for a stage active at the same time and the data in that stage will have a flush-through effect which may lead to the wrong stage of the data being launched and being captured at the subsequent stage.

The timing between the launch and capture clocks in FIGS. 2A and 2D illustrate a "cycle-to-cycle overlap violation." A cycle-to-cycle overlap violation occurs when the capture clock for one stage is not yet at the end of cycle state when the launch clock for the subsequent stage becomes active. In FIGS. 2A and 2D, a cycle-to-cycle overlap violation is shown where the C clock of stage n (FIG. 2D) is active along with the B clock of stage n+1 (FIG. 2A).

With higher clock frequencies and process densities, this synchronization is often compromised, if not addressed specifically during the IC design. In general, the cycle time violations described above are commonly caused by variation in propagation delay between the B and C clocks signals, which propagation delay can be caused by various reasons. In the logic design stage, cycle time violations can be addressed by using the same number of levels and the same latency books for distributing both the launch and capture clocks. However, at the physical design level, cycle time violations are more difficult to address with regard to PD scheduling since cycle time violations are usually detected usually after the clocks are wired and timed late into the physical design cycle. Also complexities arise for a PD solution because of process variation in manufacturing causes differences in latency values for books that are defined to have the same latency when the books are placed in different locations on the chip.

One way to maintain synchronization between capture and launch clocks due to silicon process variation is to generate the clock signals from a single source with the necessary time buffer between them and distribute the signals throughout the design with the same propagation delay so that they remain synchronized using Local Clock Buffers (LCBs) and multi IO post LCB repeaters. Using the LCB methodology the launch and capture clocks are generated from the same oscillator signal and distributed using multiple IO post LCB clock buffers. FIG. 3A schematically illustrates a Local Clock Buffer (LCB) circuit (30) that generates B and C clock signals with the appropriated mid-cycle un-overlap time based on a single input clock signal OSC. The test clock A signal is generated by the LCB (30) from an ACLK input signal. FIG. 3B illustrates a post LCB repeater circuit (31) which includes multiple buffers within a single book. The repeater (31) is designed so that the distribution of the three clocks A, B and C are completely synchronized with each other. The LCB (30) and repeater (31) clocking system maintains clock synchronization by minimizing propagation delay caused by silicon process variation due to the buffers. The process variation involved with the silicon in the buffers is minimized since the buffers are physically disposed in next to each other. In short, LCB methodology eliminates the possible lack of synchronization of the B and C clocks due to silicon process variation.

Although LCB distribution frameworks address delay difference due to silicon variation, for higher frequency designs, synchronization of the B and C clock signals may be compromised due to variation in propagation delay in the metal wires used to connect the pins between the LCBs and repeater stages. Balanced wiring is one solution that can be used to ensure that propagation delay due to the wires is maintained the same. However, balanced wiring does not address variation in propagation delay in wires caused by metal process variation when the wire segments between the B and C clocks are not physically located in proximity to each other. Indeed, if the capture/launch clock wire pairs have the same length but are not physically located near each other, metal process variation (e.g., variation in line resistance, profile, etc.) between the wire pairs may exist, causing different propagation delays over the B and C wires.

One way to combat this problem is to route B and C clock wire pairs in parallel to each other with a minimum distance between them. But this results in noise interference between the B and C clocks. Indeed, even though B and C clocks may be considered as exact compliments from a high level design standpoint, the B and C clocks are commonly misaligned by some time margin for the purpose of achieving the cycle-to-cycle un-overlap (as discussed above with reference to FIGS. 2A and 2B. Therefore, running the wires in parallel right next to each other makes them susceptible to coupled noise interference between each other and will degrade the signal integrity.

In view of the above, no effective solution exists for addressing and eliminating cycle time overlap violations upfront in the design cycle for VSLI designs. As such, mid-cycle and cycle-to-cycle overlap problems typically arise as timing violations at the end of the physical design cycle where the full chip is wired thereby forcing the physical designer to deal with such timing violation on a selective manual basis, The late stage wiring modification becomes an extremely sensitive issue to deal with from a timing closure standpoint at such late stage of design as any changes to the clock wires can have a ripple effect on the timing for the rest of the design and all these changes can have a telling effect on the design schedule. Therefore, a method is needed to address these potential timing issues earlier in the design cycle

SUMMARY OF THE INVENTION

In general, exemplary embodiments of the invention include wiring structures and methods for integrated circuit designs, which are adapted to reduce metal variation effects on launch-capture clock pairs in order to minimize cycle time overlap violations in launch/capture clocking systems. In one exemplary embodiment, this is achieved by designing A/B/C (test/launch/capture) clock wire nets using a five parallel track wire segment, where the B clock wire is represented as a double track with one metal track and one adjacent isolation/shielding track, where the C clock wire is represented as a double track with one metal track and one adjacent isolation/shielding track, and where the A test clock wire is a single track comprising test signal wire disposed between the B and C signal wires. In this exemplary wiring framework, the A clock wire acts as a shield between the B and the C clock wires to minimize coupled noise interference between the B and C clock signals. Moreover, the isolation/shield tracks serve to protect the B-C clock pairs from the noise interference from external wires, wherein shielding is provided by using a dummy wire track or a power supply/ground wires (non-signal metal wires) lines to provide "shielding" from high frequency signal lines, or wherein isolation is provided by using empty tracks comprising empty spaces that are sized according to routing design rules, but are devoid of any metal signal or power tracks so as to provide isolation for the B and C clock signal wires from external wiring.

In one exemplary embodiment of the invention, a computer implemented method is provided as part of an integrated circuit design tool to form interconnect wiring in an integrated circuit design. The computer implemented method allows a user to physically design interconnects for an integrated circuit design, such as a VSLI chip design by:

providing as input a clock netlist of a clock distribution network which comprises a list of logic books forming the clock distribution network and which specifies interconnections between test clock pins, launch clock pins and capture clock pins of source and sink logic books;

providing as input a placement information that specifies a physical location assigned to each logic book of the clock netlist in a layout of a top-level circuit;

for each logic book in the clock distribution network, adding a temporary clock pin at a point in a block level layout of that logic book, which is equidistant from the launch and capture clock pins of that logic book;

forming a physical interconnect between the temporary pins of a source logic book and sink logic book using one or more five parallel track wire segments, wherein for each five parallel track wire segment forming an interconnect, a center track is specified as a test clock signal wire, a first pair of adjacent tracks on a first side of the center track is specified as launch clock wire and a second pair of adjacent tracks on a second side of the center track specified as a capture clock wire, and wherein the launch and capture clock wires each comprise (i) a signal wire track disposed on opposing sides of the center test clock signal wire to act a shield between the launch and capture clock signal wire tracks, and (ii) an empty track or shielding wire track disposed adjacent the clock signal wire track that serves to isolate or shield the launch and capture clock signal wires;

for each logic book, forming single wire connections between the test, launch and capture of that logic book and open ends of the test, launch and capture signal wires at the temporary pin; and removing the temporary pins in the block level layout of each logic book in the clock distribution network.

These and other exemplary embodiments, features and advantages of the present invention will be described or become apparent from the following detailed description of exemplary embodiments, which is to be read in connection with the accompanying drawings.

BRIEF DESCRIPTION OF THE DRAWINGS

FIGS. 2A-2D are timing diagrams that illustrate cycle-time issues with regard to synchronization of launch and capture clocks in a master-slave latch circuit of FIG. 1.

DETAILED DESCRIPTION OF EXEMPLARY EMBODIMENTS

Figure 4:
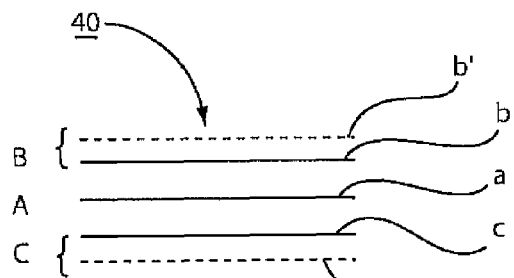
FIG. 4 schematically illustrates an exemplary layout pattern of a track segment including launch and capture clock signal wires according to an exemplary embodiment of the invention.

In accordance with exemplary embodiments of the invention, wiring solutions are provided to reduce the effects of metal process variation and related timing problems, such as mid-cycle and cycle-to-cycle overlap violations, associated with launch and capture clocks in master/slave latches used for clocking circuits in VLSI designs. For example, FIG. 4 schematically illustrates an exemplary layout pattern of a track segment including launch and capture clock signal wires according to an exemplary embodiment of the invention. In FIG. 4, the A/B/C clock wire set is depicted as a five parallel track wire segment, where the B clock wire is represented as a double track with one metal track (b) and one adjacent isolation/shielding track (b'), where the C clock wire is represented as a double track with one metal track (c) and one adjacent isolation/shielding track (c'), and where the A test clock wire is depicted as a single track comprising test signal wire (a) disposed between the B and C signal wires (b) and (c). In this exemplary layout, the A clock wire (a) acts as a shield between the B and the C clock wires (b) and (c) to minimize coupled noise interference between the clock signals on (b) and (c) Moreover, the isolation/shield tracks (b') and (c') serve to protect the B-C pair from the noise interference from external wires. In FIG. 4, the tracks (b') and (c') may be actual non-signal metal lines (e.g., ground or power lines) to provide "shielding" from high frequency signal lines, or simply spaces that are sized according to routing design rules, but are devoid of any metal signal or power tracks so as to provide isolation for the (b) and (c) clock wires.

The exemplary wiring solution of FIG. 4 is premised on the fact that test clock A is inactive during the functional mode of the chip where B and C clock signals are not affected during normal operating modes by signals propagating on the A test clock wire, since A is only active during a test mode. Therefore from a functional mode standpoint, the A clock can be considered as a quiet net for the B and C clocks. This implies, the A clock embedded between B and C clocks will act as a shield between them in functional mode. The proposed wiring solution provides a five parallel track wire segment for the A/B/C clock wire set which makes it more feasible for a PD engineer to employ this method upfront in the design cycle, without resulting in undue wiring congestion. The wiring solution addresses the potential mid-cycle and cycle-to-cycle overlap timing issues due to metal variance affects due to balanced and parallel B and C nets being disposed next to each other without the coupling interference and with minimal wiring track usage.

In accordance with exemplary embodiments of the invention, CAD tools for enabling physical synthesis of chip designs can be extended using wire solutions premised on the framework of FIG. 4 for the physical design of clock wire nets. For example, the wiring solution of FIG. 4 can be implemented as part of the physical design stage as predefined wire segment models or existing wire segment models extended using "isolate_half" wire codes for the B and C clock wires, where an "isolate_half" wire code can refer to a double track segment having a single clock signal wire and isolation or a shielding wire on one side of the clock signal where the position of the isolation/shield is defined by the direction of the wire segment in the chip layout from a source node to a sink node of the clock net in the chip layout.

Figure 5:
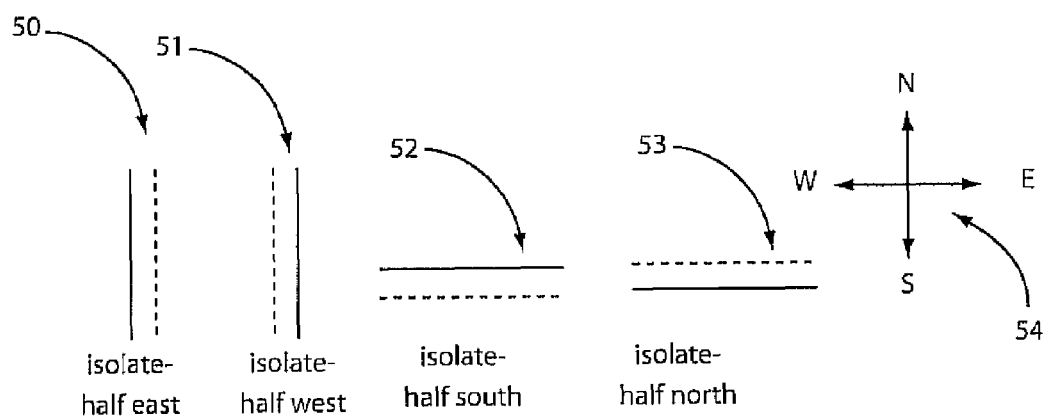
FIG. 5 schematically illustrates a set of "isolate_half" wire codes that may be utilized to define interconnects between logic books or cells in a clock net, according to an exemplary embodiment of the invention.

FIG. 5 schematically illustrates a set of "isolate_half" wire codes that may be utilized to define interconnects between logic books or cells in a clock net, according to an exemplary embodiment of the invention. In particular, FIG. 5 schematically illustrates an "iso_half_east" wire segment (50), an "iso_half_west" wire segment (51), an "iso_half_south" wire segment (52) and an "iso_half_north" wire segment (53), wherein each segment includes a solid line that denotes a signal wire track and a dotted line that denote an isolation (empty) or shielding track. The exemplary wire segments (50)~(53) comprises a set of sub_wire codes that may be used to define a "isolate_half" clock wire segment based on the direction of the wire segment and the position of the isolation/shielding track relative to the signal wire. For purposes of illustration, the "isolate_half" track segments in FIG. 5 are distinguished based on direction labels of North, South, East and West according to the exemplary coordinate system (54) in FIG. 5

In particular, based on the coordinate system (54) in FIG. 5, the double track "isolation_half" segments (50) and (51) are shown orientated in the North-South direction, while the double track segments (52) and (53) are orientated in the East-West direction. The "isolate_half" segment (50) includes an extended label "east", to denote that the segment (50) is orientated in the north-south direction and that the isolation/shielding track is positioned east of the signal track. Similarly, the "isolate_half" segment (51) includes a label "west", to denote that the segment (51) is orientated in the north-south direction and that the isolation/shielding track is positioned west of the signal track. The "isolate_half" segment (52) includes an extended label "south", to denote that the segment (52) is orientated in the east-west direction and that the isolation/shielding track is positioned south of the signal track. Similarly, the "isolate_half" segment (53) includes a label "north", to denote that the segment (53) is orientated in the east-west direction and that the isolation/shielding track is positioned north of the signal track. The four sub wire codes shown in FIG. 5 with different labels north, south, east and west cover the various wiring scenarios for wiring the B and C clocks with the isolate_half code.

Figure 6:
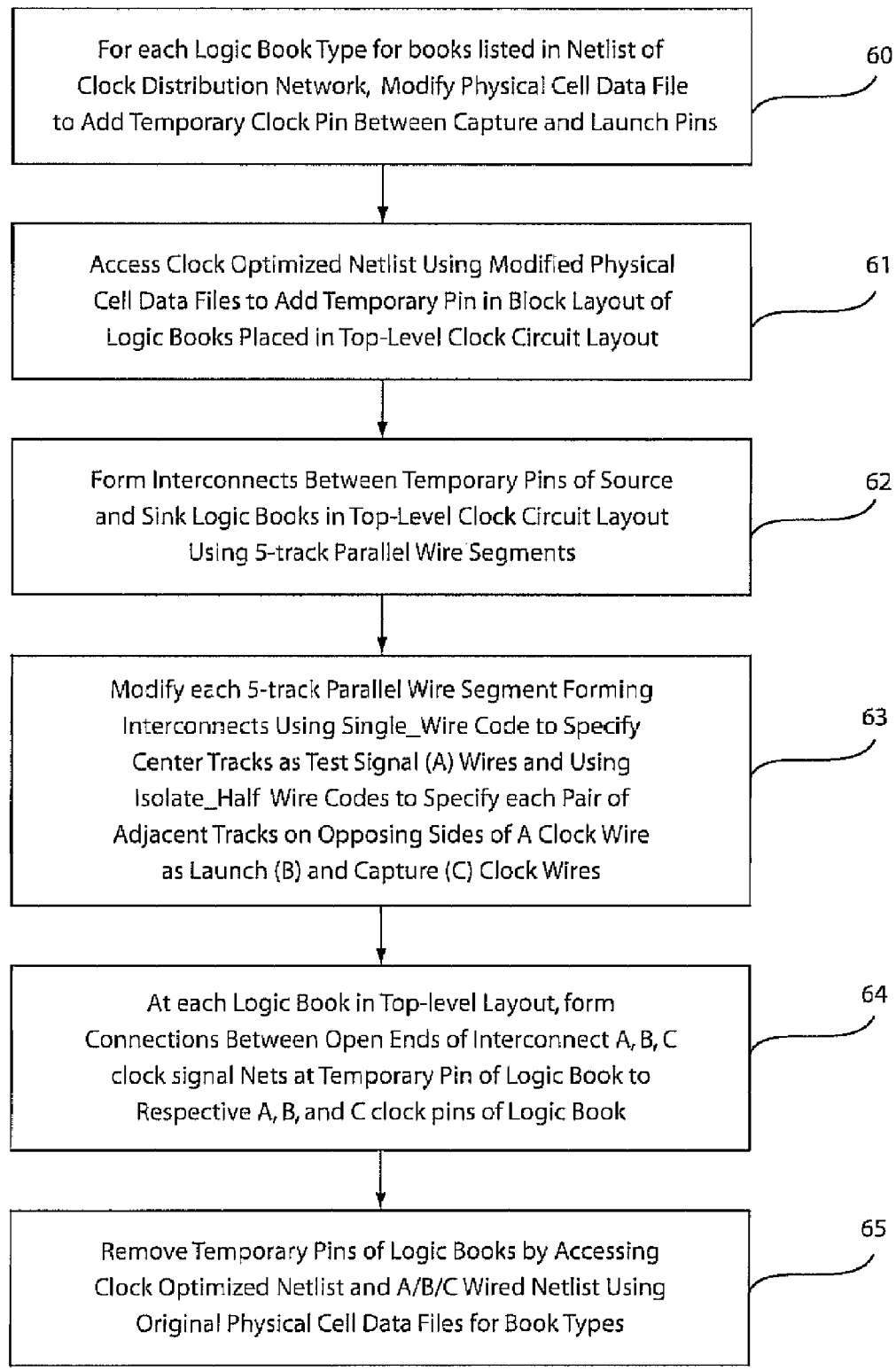
FIG. 6 is a flow diagram illustrating an exemplary computer-implemented wiring routine according to an exemplary embodiment of the invention, which can be implemented as part of a physical design CAD tool for wiring release and capture clock nets using wire track segments for A/B/C clock wires as shown in FIG. 4.

A computer-implemented wiring method using a five parallel track wire segment framework of FIG. 4 defined using "isolate_half" wire codes according to an exemplary embodiment of the invention will be discussed with reference to FIG. 6. In particular, FIG. 6 is a flow diagram illustrating a computer-implemented wiring routine according to an exemplary embodiment of the invention, which can be implemented as part of a physical design CAD tool for wiring release and capture clock nets using wire track segments for A/B/C clock wires as shown in FIG. 4. The exemplary method of FIG. 6 is a routine that is performed following a logical synthesis stage and after initial placement of logic books (or cells) in a physical design stage. As discussed above, the output of the logic synthesis tool is a net list, which comprises a list of logic books or cells for a given circuit designs and which specifies nets of interconnections between books/cells in the given design, where each net is a list of the cells that have pins to be interconnected. As noted above, the physical design process generally comprises a "placement" and "routing" design stages, wherein a placement process is performed to assign to each logic book in the netlist to a physical location (layout region) on the chip, and wherein a routing process is performed to assign each net in the net list a set of wire segments which that form the interconnections defined by the net.

Figure 1:
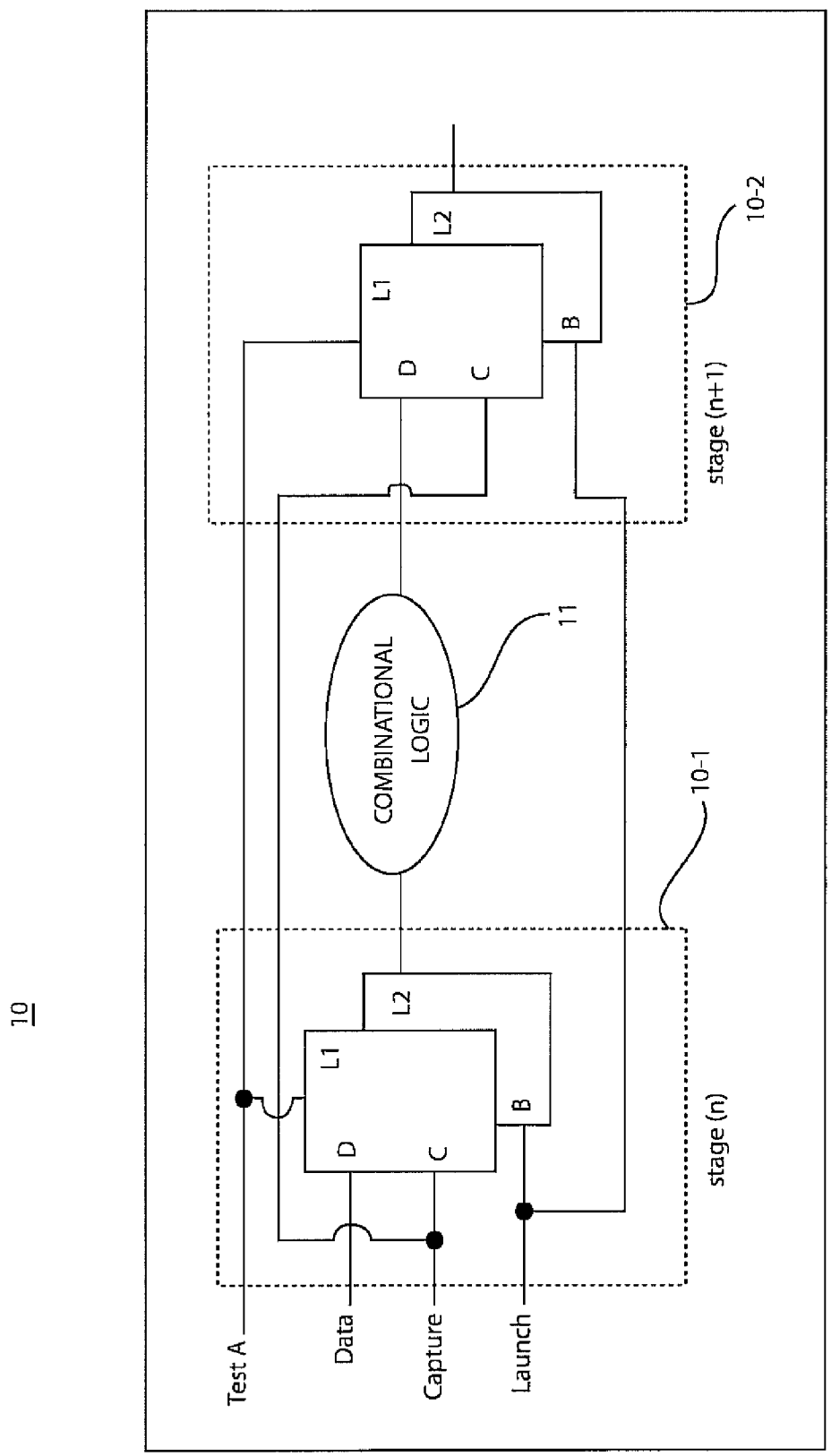
FIG. 1 is a schematic block diagram of a master-slave latch logic circuit in which wiring methods according to exemplary embodiments of the invention may be implemented for launch and capture clock wires to minimize cycle-time violations.
Figure 3A:
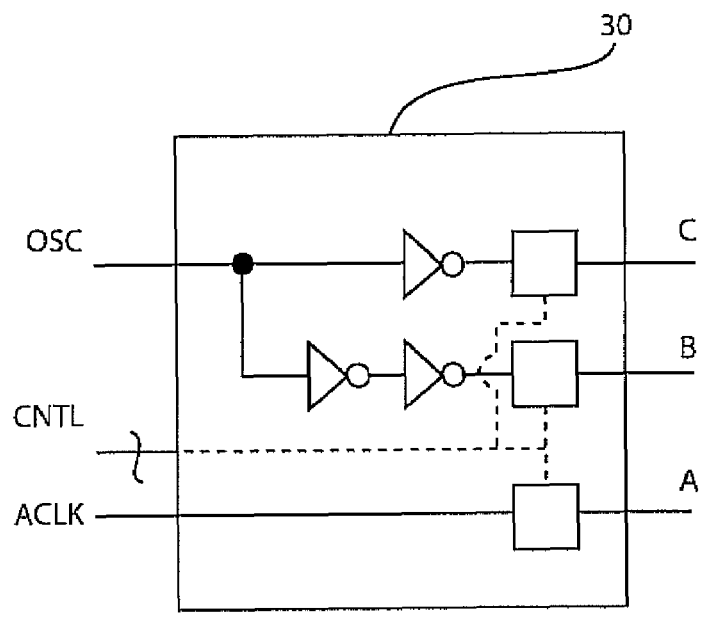
FIG. 3A schematically illustrates a logical Local Clock Buffer (LCB) circuit that generates B and C clock signals with appropriate mid-cycle un-overlap time based on a single input clock signal OSC.
Figure 3B:
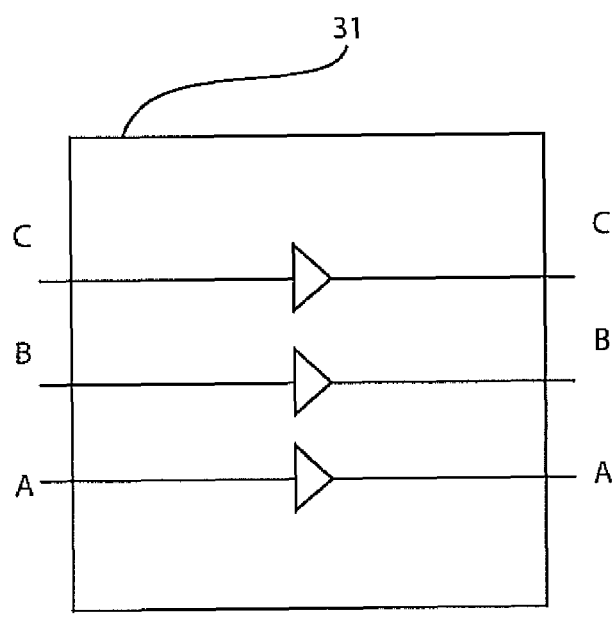
FIG. 3B schematically illustrates a post LCB repeater logic circuit which includes multiple buffers within a single book.

By way of specific example, in the context of launch and capture clocks in a master-slave latch clocking system, a clock distribution network for a given design may comprise a plurality of logic books for various book types including LCB books (FIG. 3A) and repeater books (FIG. 3B) that form a clock distribution net. During logical synthesis, the circuit netlist for the clock distribution network can be designed and analyzed using a timing tool that provides a timing analysis of the circuit netlists, which enables the logic design to be optimized to meet the desired timing constraints. In this regard, logical synthesis results in a clock optimized netlist that is used as input information for the physical design stage. Moreover, each logic book listed in the clock distribution netlist can be defined according to one of a plurality of predefined logic book types (e.g., LCB and repeaters), wherein each logic book type contains general information such as the name, type and functionality of the cell as well as physical cell information (such as the size and shape of the cell, and the location, size, and shape of the cell pins and routing blockages) which pertains to a block level circuit layout for the given logic book. The placement process provides information regarding the physical layout locations of the logic books that are specified in the netlist.

Referring now to FIG. 6, an initial step for the exemplary wiring process includes for each logic book (or cells) in the clock net layout, at least one temporary pin (T) added to each logic book (or cells) in the clock net layout to define branch point location for connecting A/B/C clock signal pins for a given logic book to the open end of a five parallel track wire segment forming interconnect wiring for A/B/C clock wires between logic books/cells in the clock net (step 60). This process can be performed by modifying the physical cell data for each book type of logic books in the clock tree network of the given design by adding a temporary pin to a block level layout of the given book type as defined by the physical cell data for the book type. This process is graphically illustrated in FIG. 7. With the physical cell data information, the CAD system can graphically display a schematic layout for the circuit block specified by a given logic book type. For example, FIG. 7 schematically illustrates a block level layout for a given logic book (70) where the size and shape of the logic book is defined by a bounding box (71) and where the clock pins A, B and C are graphically shown at locations with respect to the cell layout area within the bounding box (71).

Figure 7:
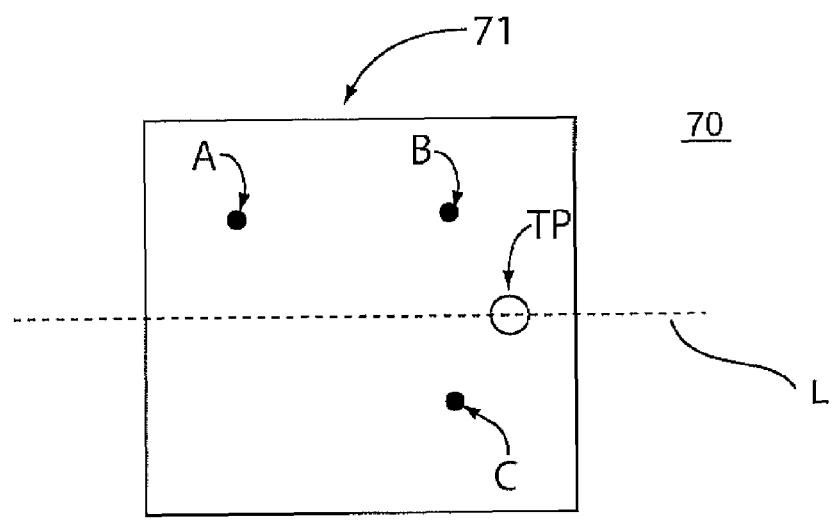
FIG. 7 schematically illustrates a method for selecting a physical location of temporary pin between launch and capture clock signal pins in the physical layout of a logic book, according to an exemplary embodiment of the invention.

FIG. 7 schematically illustrates a method for selecting a temporary pin location in the physical layout of the logic book (70). In general, for a given logic book, the location of the temporary pin T is selected to be at some point that is equidistance from the locations of the B and C pins for the given logic book, where the point is chosen to minimize said distance, considering any blockage. For example, as depicted in FIG. 7, this process may be performed by displaying a line L in the block level layout, which defines an equidistant axis between B and C pins for a given cell layout, and allowing the designer to selecting a point along the line L to find and select a potential unblocked point for the temporary pin T. As noted above, the temporary pin (T) is added to define branch point location for connecting the A/B/C clock signal pins to the open ends of a five parallel track wire segment forming interconnect wiring for the A/B/C clock wires between logic books/cells in the clock net. It is to be noted that the original physical cell information for the logic book layout is persistently maintained for subsequent access and use, and the modification to the block level layout of the logic book is performed by modifying a copy of the physical cell data file for the given logic book to add the physical cell information for the temporary pins.

Referring again to FIG. 6, a next step is to access the clock optimized layout netlist using the modified physical cell data files for each logic book (LCB and repeater books) in the netlist so that the temporary pin data is included in the topology of the logic books placed in the physical layout (step 61). In particular, this process involves annotating the modified physical cell data for each logic book type into the logic books specified in the circuit netlist and placement information so that the physical locations of the temporary pins are added to the physical layout for each logic book placed in the top level circuit layout.

Next, interconnections are formed between source and sink logic books according to the layout netlist by wiring temporary five parallel track wire segments between the temporary pins of source and sink logic books for each of the A-B-C clock net sets (step 62). With this process, the temporary pin of a given source logic book is connected to temporary pins of each sink logic book using a five parallel track wire segment with tracks that are sized and spaced according to a design rule constraint. This process may be part of a global routing process where the interconnects for the clock nets are automatically generated using predefined five parallel track wire segment models.

Next, the temporary five parallel track wire segments that form temporary interconnects are modified using wire codes to specify three separate wire tracks for the A, B and C clocks lines (step 63). For instance, the center track of each five parallel track wire segment is specified as the A clock signal line using a "single_wire" code to define the physical parameters of the center track of the temporary five parallel track wire segment. The two tracks on each side of the center track (A wire) are specified as the B and C clock wires using "isolate_half" wire codes as discussed above where the tracks adjacent to each side of the A track are specified as C and B signal wires, and where the outer tracks of each 5 track wide segment are specified as empty tracks or shielding tracks for the corresponding B and C wires according to sub wire codes (north, south, east, west) based on segment direction and the position of the isolation/shielding tracks with respect to the corresponding B and C signal wire tracks. This process results in the specification of the clock net interconnects that are formed between the temporary pins of the source and sink logic books in the top level circuit layout using the 5 track framework of FIG. 4, wherein the center track A at the end of each interconnect is aligned to the temporary pin.

A next step in the wiring process involves forming connections between open ends of the nets at each temporary pin to the A, B and C pins of the logic book (step 64). In particular, for each logic book placed in the layout, the end portions of the A, B and C signal lines at the location of the temporary pin are connected to respective A, B and C pins of the logic book using single wire codes. In this process, since the open end of the A signal line is aligned to the temporary pin, and the temporary pin is located at some point equidistant from the B and C pins, the physical wire connections that are formed between the open ends of the B and C signal lines and the B and C pins will have the same length.

The above wiring routine generates information regarding the physical layout of the clock signal wiring of the clock nets for the given clock distribution network, and this wiring information is incorporated in the topology of the layout netlist. Once the wiring is complete, the temporary pins are removed by accessing the clock optimized and A-B-C wired netlist using the original physical cell information of the book types for each of the logic books (e.g., LCB and repeater books) in the given layout (step 65). In particular, with this process, the original clock optimized netlist is annotated with the physical data associated with the cell placement, original physical cell layout data for each logic book type, and physical layout and the A/B/C clock net wiring, to thereby generate a physical layout model excluding the physical information of the temporary pins, which are not to be included or considered in the ultimate design. Thereafter, timing analysis routines can be applied to the physical layout models as necessary to further optimize the physical layout design.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A computer implemented method for an integrated circuit design tool to form interconnect wiring in an integrated circuit design, the method comprising:
   providing as input a clock netlist of a clock distribution network which comprises a list of logic books forming the clock distribution network and which specifies interconnections between test clock pins, launch clock pins and capture clock pins of source and sink logic books;
   providing as input a placement information that specifies a physical location assigned to each logic book of the clock netlist in a layout of a top-level circuit;
   for each logic book in the clock distribution network, adding a temporary clock pin at a point in a block level layout of that logic book, which is equidistant from the launch and capture clock pins of that logic book;
   forming a physical interconnect between the temporary pins of a source logic book and sink logic book using one or more five parallel track wire segments,
      wherein for each five parallel track wire segment forming an interconnect, a center track is specified as a test clock signal wire, a first pair of adjacent tracks on a first side of the center track is specified as launch clock wire and a second pair of adjacent tracks on a second side of the center track specified as a capture clock wire,
      wherein the launch and capture clock wires each comprise (i) a signal wire track disposed on opposing sides of the center test clock signal wire to act a shield between the launch and capture clock signal wire tracks, and (ii) an empty track or shielding wire track disposed adjacent the clock signal wire track that serves to isolate or shield the launch and capture clock signal wires;
   for each logic book, forming single wire connections between the test, launch and capture of that logic book and open ends of the test, launch and capture signal wires at the temporary pin; and
   removing the temporary pins in the block level layout of each logic book in the clock distribution network.

* * * * *